United States Patent [19]

Tomlinson

[11] 4,276,648

[45] Jun. 30, 1981

[54] MIDVALUE SIGNAL SELECTION AND FAULT DETECTION APPARATUS AND METHOD

[75] Inventor: Lloyd R. Tomlinson, Renton, Wash.

[73] Assignee: The Boeing Company, Seattle, Wash.

[21] Appl. No.: 71,902

[22] Filed: Sep. 4, 1979

[51] Int. Cl.³ .................. G06F 11/18; G06B 9/03
[52] U.S. Cl. ........................................ 371/68; 318/564
[58] Field of Search .................... 371/68, 62, 11, 4; 318/564

[56] References Cited

U.S. PATENT DOCUMENTS

| | | | |
|---|---|---|---|
| 3,054,039 | 9/1962 | Meredith | 318/564 |
| 3,070,071 | 12/1962 | Cooper | 318/564 X |
| 3,125,712 | 3/1964 | Meredith | 318/564 |
| 3,309,588 | 3/1967 | Martin et al. | 318/564 |
| 3,334,282 | 8/1967 | Wolfe | 318/564 |
| 3,469,162 | 9/1969 | Goslin | 318/564 |
| 3,526,756 | 9/1970 | White | 364/578 |
| 3,551,776 | 12/1970 | Tawkik | 318/564 |
| 3,573,587 | 4/1971 | Bishop et al. | 318/564 |
| 3,708,735 | 2/1973 | Barltrop | 318/564 |
| 3,805,235 | 4/1974 | Foster et al. | 371/68 X |
| 3,979,720 | 9/1976 | Laas et al. | 318/564 X |
| 4,105,900 | 8/1978 | Martin et al. | 318/564 X |
| 4,130,241 | 12/1978 | Meredith | 371/68 |

FOREIGN PATENT DOCUMENTS 1334531 10/1973 United Kingdom .
396011 8/1973 U.S.S.R. .

Primary Examiner—David H. Malzahn
Attorney, Agent, or Firm—James P. Hamley; Bernard A. Donahue

[57] ABSTRACT

Multiple redundant sensor signals are processed through an equalizing and selecting network which outputs the midvalue signal and eliminates all null offsets occurring among signals. Errors due to drift in a signal are minimized by bounding the output to the limits of the remaining redundant signals. Faults of both a high and low frequency nature are detected resulting in the isolation of the appropriate signal channel.

10 Claims, 3 Drawing Figures

# MIDVALUE SIGNAL SELECTION AND FAULT DETECTION APPARATUS AND METHOD

BACKGROUND OF THE INVENTION

This invention pertains to the electrical signal processing art and, more particularly, to a method and apparatus for the selection of one of several redundant signals.

Redundant channel signal processing is well known to the prior art. A particular example is the aviation art, wherein several sensors each sensing the same airplane parameter provide corresponding output signals. Processing circuitry receives the redundant signals, and includes a means to select that signal, or a combination of signals which is most likely to be representative of the actual airplane parameter.

In one prior art approach to redundant signal processing, the signal output by the processing network is that signal having a midvalue between the other input signals. Equalization of all signals, to eliminate null offsets among the various sensors, is accomplished through a first order lag circuit. Signal monitoring detects a fault on a channel and, upon such fault substitute a zero for the failed input signal.

This approach suffered numerous deficiencies. First, lag circuit equalization did not completely eliminate failure transients. Second, the output incurs a dead zone about zero after isolation of a first failure. This dead zone resulted from the fact that for substantial time periods the zero substituted signal is the midvalue signal, with this midvalue zero signal being outputted as representative of the parameter being monitored. Finally, fault monitoring in this system is less than optimum.

In a second approach, an output is produced which is the average of the inputs. A defect of this approach is that it depends heavily on the signal monitoring to protect against failure transients. Large control error transients can occur before faults are detected and isolated. Complex schemes are devised to take questionable signals out of the averaging process as soon as monitoring thresholds are exceeded, and then monitoring a time delay to determine if the signal should be locked out permanently or returned to the averaging process. Lag equalization is sometimes provided to allow using smaller monitoring thresholds, but the lag equalization in combination with the average selection has the deficiency of allowing slowover faults to cause large errors in the output before the fault can be detected.

In a third prior art approach, the output is selected as a master channel with monitoring causing the system to switch to an alternate channel if the master channel fails. This process is limited in that the monitoring cannot provide 100% protection against first faults. Further, in requiring that a master channel exist, selection and control can not be identical on all three channels.

In a final approach, the output is selected as the midvalue of inputs and integral equalization is used to completely eliminate static offsets between the signals. However, a defect in this system has been that the equalizing integrators can drift allowing the output signal to go beyond boundaries defined by the nonfailed input signals. This results in an output signal which is not truly representative of the parameter being sensed.

SUMMARY OF THE INVENTION

It is an object of this invention, therefore, to provide signal selector apparatus which is capable of selecting that input signal most representative of a parameter being sensed and which does not exhibit null offset or drift error.

It is a particular object of the invention to provide the above-described signal selector apparatus in which the output is bounded by the existing remaining, i.e. nonfailed, channels in a manner that minimizes failure transients and excludes oscillatory failures from affecting the output.

It is a further object of the invention to provide a method for signal selection, which method insures that the best of several input signals is selected with full equalization and complete monitoring on all channels.

It is an additional object of the invention to provide the above method for signal selection which allows changing monitoring thresholds and threshold exceedance time counts without increasing faiure transients.

Briefly, according to the invention, the signal selector apparatus selects one of several input signals. The apparatus comprises a midvalue selector which has a plurality of inputs and an output. The midvalue selector passes that input signal having a value between the other input signals to its output. An equalizer processes each input signal and eliminates null offsets contained therein. The equalizer further includes a means which intercouples the midvalue selector and the equalizer such that the signal produced at the midvalue selector output is the midvalue one of the input equalized signals bounded by those input signals having values above and below the midvalue.

Preferably, the equalizer comprises an equalizing channel for each input signal. Each equalizing channel includes an integrator, a combiner and a second midvalue selector. The combiner combines the signal at the input of the equalizing channel with the output of the midvalue selector and passes the resultant signal to the input of the integrator. The second midvalue selector receives the outputs from all of the equalizing channel integrators and passes that signal having a value between the other signals to its output. The passed output from the midvalue selector is coupled to the input of the integrator.

The method of selecting one of several information signals includes the step of providing a midvalue selector which passes that input signal having a value between the other input signals to its output. Each information signal is equalized, with the equalized signal being passed to the input of the midvalue selector. There is no long term effect on the midvalue passed signal, whereas the other signals are equalized such that their nominal value matches that of the equalized midvalue signal. Cooperation exists between the equalizer and the midvalue selector such that the midvalue output from the selector is bounded by the other information signals.

DETAILED DESCRIPTION OF THE PREFERRED EMBODIMENT OF THE INVENTION

Figure 1:
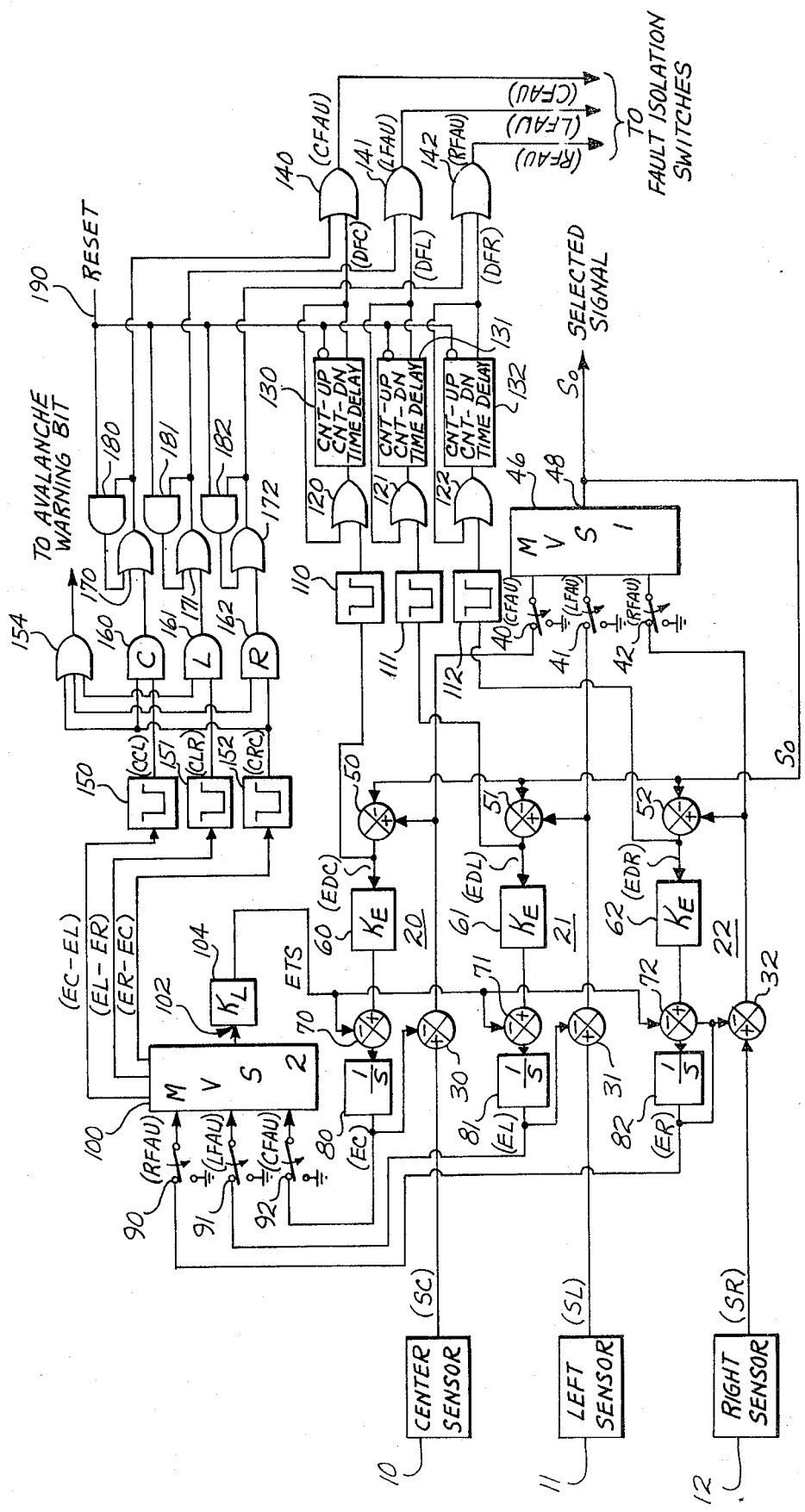
FIG. 1 is a schematic diagram of the preferred analog embodiment of the signal selecting apparatus.

FIG. 1 illustrates the preferred analog embodiment of the invention. Here, a series of three sensors 10-12, designated center, left and right, respectively, are shown. These sensors are all arranged to monitor the same parameter, such as, for example, lateral acceleration in an aircraft. The sensors 10-12 produce output signals SC, SL and SR, respectively. These signals are, thus, informational in nature having a magnitude and/or frequency and/or phase corresponding to the parameter being sensed. Each signal has a return to zero characteristic absent variance in the sensed parameter.

Each sensor 10-12 produced information signal is processed through a corresponding equalizing channel 20-22, respectively. Thus, each information signal SC, SL and SR is passed to the "plus" input of a summing circuit 30-32, respectively. The summed output from each summing circuit 30-32 is fed via fault isolation switches 40-42, respectively to one of three inputs of a first midvalue selector 46. The mean value selector 46, operating in the conventional manner, passes that input signal having a value between the other input signals to an output terminal 48. The design of such midvalue selectors is well known to anyone of ordinary skill in this art, and as such, will not be discussed in further detail here.

The signal $S_o$ at the output 48 of midvalue selector 46 constitutes the output from the signal selector apparatus. This signal is also fed to the "minus" input of a series of combiners or adders 50-52. Coupled to the "plus" input of summers 50-52 is the equalized signal from the summers 30-32. The resultant output from the summers 50-52, designated as EDC, EDL and EDR corresponding to equalized different signal center, left, and right are multiplied by gain factors $K_e$ in gain blocks 60-62.

The output from each gain block 60-62 is passed to the "plus" input of summing circuits 70-72. The output from each summing circuit 70-72 constitutes the inputs of corresponding integrators 80-82. The integrators, acting in the conventional manner, integrate the signals at their inputs and produce the resultant at their outputs. These output signals are designated EC, EL and ER, respectively.

Each of the outputs from the integrators 80-82 is fed through corresponding fault isolation switches 90-92 to inputs of a second midvalue selector 100. Thus, as with midvalue selector 46, midvalue selector 100 selects that one of its input signals having a value between the other two, producing this signal at its output 102. The selected output from midvalue selector 100 is multiplied by a predetermined gain factor $K_L$ in gain block 104. The resultant signal is designated ETS, corresponding to equalization tracking signal.

The ETS signal is coupled to the "minus" input of each summing circuit 70-72.

In operation, that integrator 80-82 located in the equalization channel carrying the midvalue signal, as selected by midvalue selector 46, has feedback around it through midvalue selector 100, gain block 104 and summing circuit 70-72 which causes it to become a first order lag filter for the input signal (EDC, EDL or EDR). Since the same feedback signal ETS goes to the remaining integrators, they will shift in the same direction as the integrator located in the channel which processes the midvalue signal. The end result is that the equalizing integrator in the channel with midvalue input will always progress to and hold zero output on the long term "steady state" response. With the midvalue integrator zero, the other two integrators run until the nominal "i.e. zero or null" values of their equalized signals exactly match the nominal of the midvalue signal. Thus, the integral equalization completely eliminates all null offsets between redundant channels.

There are numerous advantages obtained by the elimination of null offsets. For example, failure transients are either completely eliminated or reduced to insignificant motion if the signals should spread slightly due to gain tolerances between the three channels.

Further, upon failure and isolation of an input signal, the elimination of null offsets avoids the aforementioned two channel dead zone problem due to the fact that the remaining signals are equalized to precisely agree.

A further advantage of this process is that it inherently splits the channel disagreements into their high pass and low pass components thereby allowing improved monitoring capability without increased circuit complexity.

Thus, the high frequency components (EDC, EDL, EDR) of the difference between the information signal in each channel and the midvalue signal appears at the output of the summers or combiners 50-52. It should be noted that the equalization difference signal for the channel carrying the midvalue signal will be zero.

Each equalized difference signal is passed to a corresponding dynamic fault threshold detector 110-112. Each threshold detector 110-112 compares the input signal against a predetermined threshold limit. If the signal exceeds the limit, indicative of a mistracking of the signal from the midvalue, that threshold detector produces a high level at its output. This high level is coupled to a corresponding OR gate 120-122 thereby satisfying the OR gate and causing its output to go high. Coupled to the output of each OR gate 120-122 is a counter with internal clock 130-132, respectively. Upon receiving a high input from its corresponding OR gate 120-122 a counter 130-132 begins incrementing to a higher count state at a rate determined by its internal clock. Should the output of any threshold detector 110-112 remain high for the time necessary for its corresponding counter 130-132 to count to a predetermined state, the counter 130-132 produces a high at its output which latches the corresponding OR gate 120-122.

A high level at the output of one of the counters 130-132 satisfies a corresponding OR gate 140-142 and causes an isolation signal CFAU, LFAU or RFAU to be applied to a corresponding isolation switch 40-42 and 90-92. This, in turn, effectively disconnects that equalizing channel, thereby prohibiting a fault from having a voice in the signal selection process. In an isolated channel, the default isolation switch is returned to ground, whereby the signal selection apparatus assumes a zero input for the faulted channel.

Low frequency channel disagreement signals (EC, EL and ER) appear at the output of the integrators 80-82. The second midvalue selector 100, in the process of determining which of its input signals is at a midvalue, produces a series of difference signals, i.e. (EC-EL), (EL-ER) and (ER-EC). These difference signals represent the low frequency magnitude differences between each pair of the input signals. One equalized signal exceeding another by a predetermined threshold represents a fault in one or the other of the two signals.

Thus, this provides a warning for a failure avalanche condition which can occur if two channels spread beyond a desired threshold and thus set up a condition where no channel can be identified as failed, but a succeeding failure could cause all channels to indicate as failed.

An example of the failure avalanche condition is as follows. Assume the center channel is the midvalue channel. Also assume that the difference between the left and center, and center and right channels is below a predetermined failure threshold whereas the difference between the left and right channels exceeds a fault detection threshold. Thus, this indicates that either the left or the right signal has failed but it is not possible to determine which of the two has done so. If the center channel should then fail, the system would, within a very short time interval, indicate two of the three channels as having failed. Now, totally without warning, a catastrophic failure would be indicated. In many systems it is preferable that a warning first be given as to one unidentified channel failure such that an operator, as for example a pilot in an aircraft, will not be taken by surprise by instantaneous catastrophic failure.

Therefore, returning to FIG. 1, the difference signals (EC-EL, EL-ER, and ER-EC) are fed to corresponding threshold detectors 150-152. Each of the threshold detectors 150-152 produces a high level output if the amplitude of the signal at its input exceeds a predetermined reference threshold.

The outputs from the threshold detectors 150-152 are designated CCL, CLR and CRC, respectively. This corresponds to comparison center to left of equalization signals, left to right of equalization signals and right to center of equalization signals, respectively. Should any one of these signals go high, an OR gate 154 is satisfied, thereby indicating to an observer of this system, such as a pilot, that an avalanche condition exists. This warning will then enable the pilot to be prepared if a second of the three channels should fail.

The threshold detectors 150-152 are also connected to AND gates 160-162. Each AND gate produces a high output if its corresponding channel exceeds the threshold of both of its neighboring channels. Thus, for example, AND gate 160 produces a high output if the equalization for the center channel is beyond the predetermined threshold from the equalization for both the left and the right channels. In a similar manner, AND gate 161 senses for the left channel and AND gate 162 senses for the right channel.

The AND gates 160-162 feed to OR gates 170-172. Should any of the AND gates 160-162 go high, its corresponding OR gate 170-172 produces a high output, which high output satisfies a corresponding one of the OR gates 140-142 thus, as before, isolating an appropriate channel. A series of AND gates 180-182 provide a means of unlatching the corresponding OR gate 170-172 from the fault mode. A reset signal 190 is used to reset an indicated fault in either of the monitoring systems, thus resulting in the fault isolation switches 40-42 and 90-92 returning "on channel". Thus, as has been shown, the described signal selection system equalizes all input signals to eliminate null offsets and monitors both high frequency and low frequency effects on the channels to best isolate a faulted channel.

In addition, the cooperation between the first midvalue selector 46 and the equalizing network assures that, should the midvalue signal fail and begin drifting either to a higher or a lower value, the output $S_o$ from the midvalue selector will be bounded by the remaining two signals. That is, should the midvalue signal drift to the higher of the two remaining signals, the midvalue selector will automatically switch to that higher signal upon further drift of the midvalue signal. This bounding of the signal assures that a general drift will not create an erroneous indication of the sensed parameter.

Figure 2:
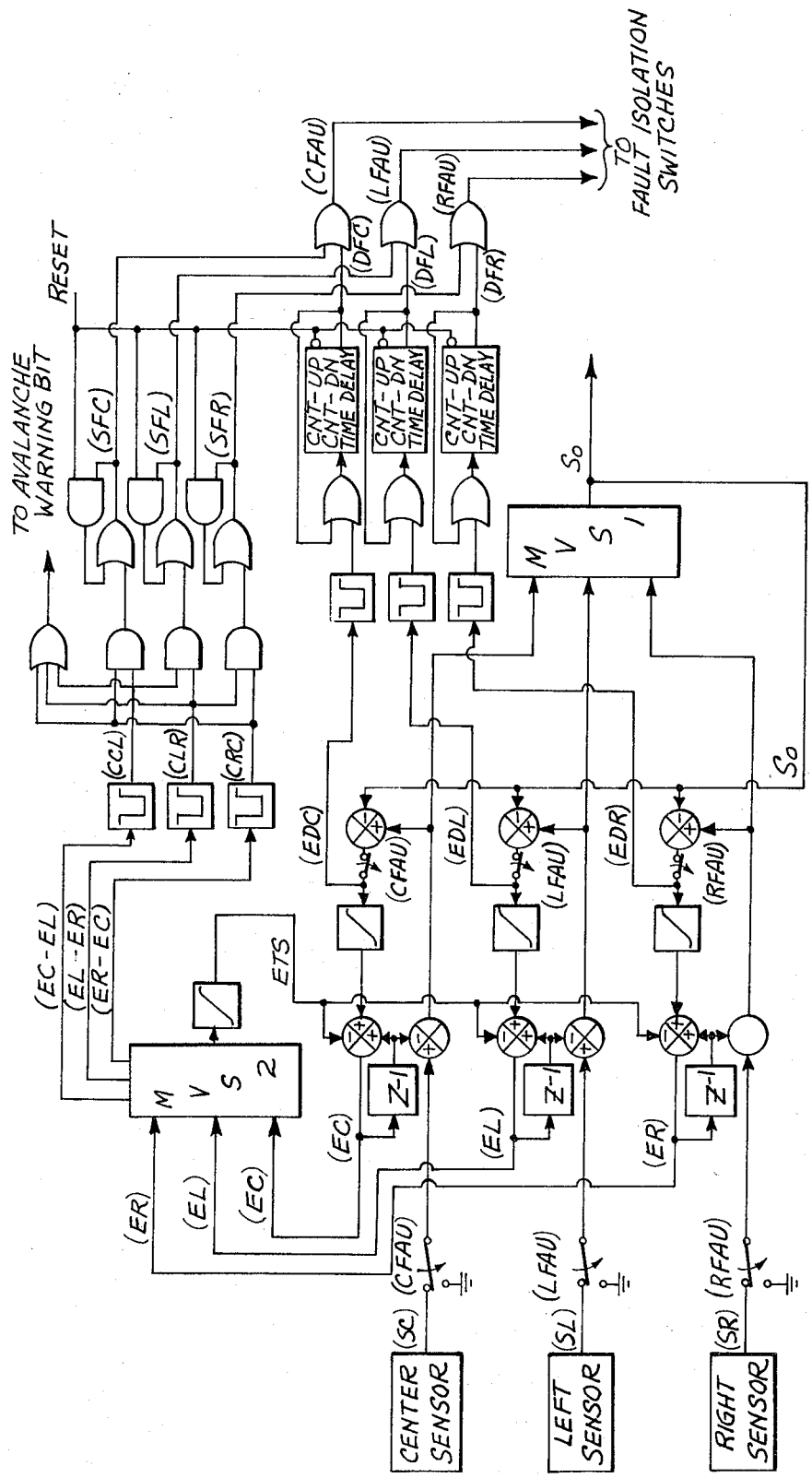
FIG. 2 is a schematic diagram illustrating one of two preferred digital embodiments of the invention.

FIG. 2 is the preferred digital embodiments of the signal selector wherein each signal has a return to zero characteristic absent variance in the sensed parameter. As such, a detailed analysis of the arrangement of each circuit will not be given since it would be readily apparent to one of ordinary competence in this art, based on the description of FIG. 1 and the topology shown in FIGS. 2 and 3, as to the manner of implementing the digital embodiments.

The digital embodiment of FIG. 2 differs from the analog version of FIG. 1 in three ways. First, a digital summation corresponding to rectangular integration is used for the integrators. Secondly, the gains KE and KL are replaced by rate limits to avoid the need for double precision calculations. Finally, the fault isolation switches have been repositioned to allow more efficient processing and to allow the use of the same midvalue select routines for both the systems shown in FIGS. 2 and 3. The switches located in the EDC, EDL and EDR signal paths are implemented by skipping over the calculations of the equalization signal and the dynamic fault monitoring for a faulted channel. When a fault is detected, the equalizing integrator is set to zero. Thus, the inputs to MVS 1 and MVS 2 are zero for the faulted channel.

This causes the output to either go to zero or be bounded between the good channel and zero after the occurrence of a second failure.

Figure 3:
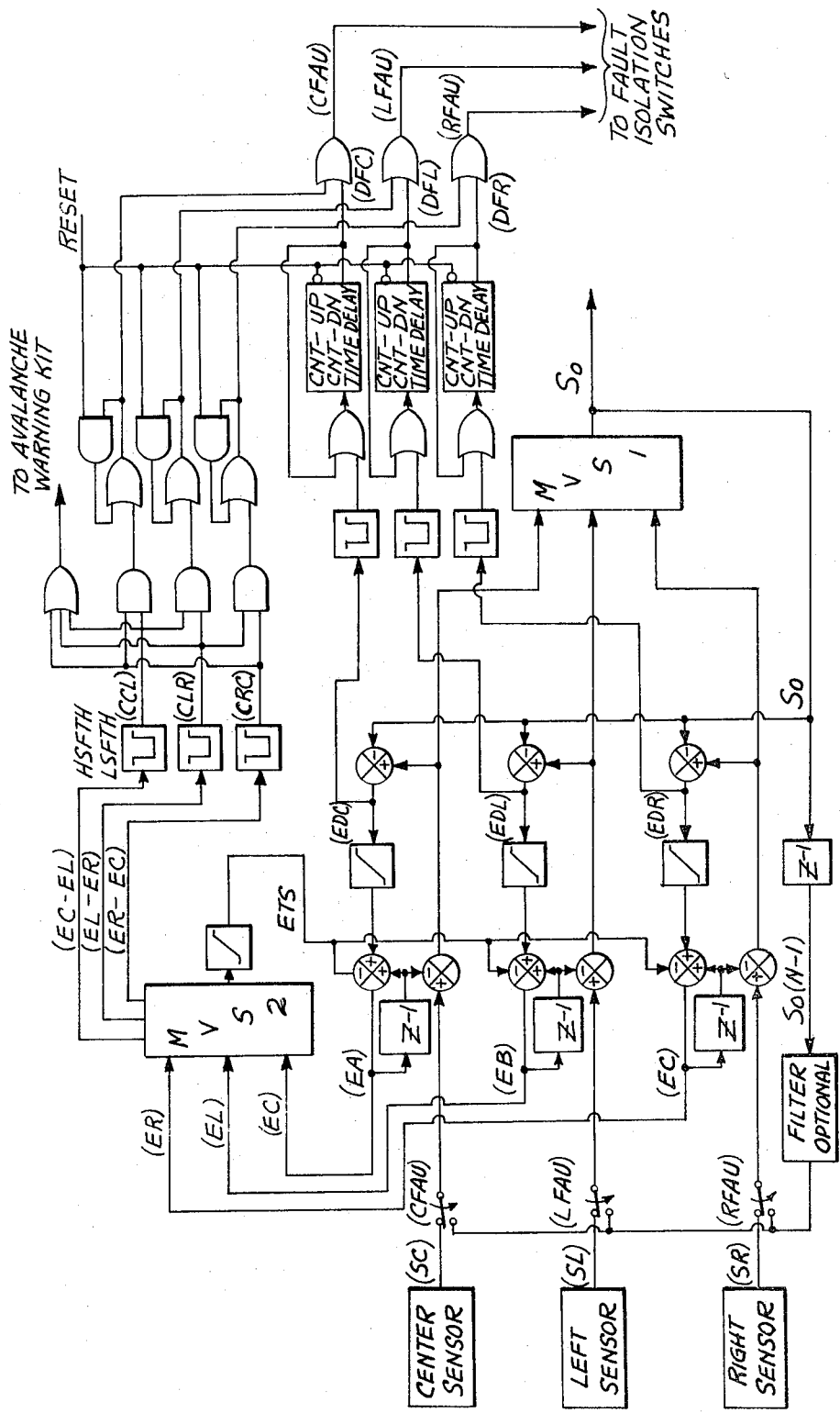
FIG. 3 is the second of two preferred digital embodiments of the invention.

The digital embodiment shown in FIG. 3 differs from that of FIG. 2 in the following ways. The two sets of fault isolate switches in FIG. 2 are replaced by one set of fault isolate switches in front of the equalization summing points. When a faulted input is isolated, the last value of the output is used to replace the faulted input signal. This arrangement has the following characteristics. After first failure the equalizer in the faulted channel acquires a value corresponding to the average rate of change of the output signal. Thus the third vote for processing the remaining two channels is a signal that is equal in magnitude to the output and changes at the average rate of change of the output. When a second failure occurs, the good channel and the faulted channels spread, leaving the previously isolated input path as the path with the midvalue signal. The value on the equalizing integrator then bleeds off at a rate controlled by the rate limit in the ETS path until the output stops. This provides a more passive failure characteristic for signals which operate for long periods of time with non-zero nominal values.

In summary, preferred embodiments of signal selectors have been shown, each of which equalizes its redundant input signals to eliminate null offsets and bounds the midvalue selected output to the values of the remaining channels. In addition, high and low frequency fault detection monitoring has been shown, which monitoring optimally isolates the faulted channel.

While preferred embodiments of the invention have been described in detail, it should be apparent that many modifications and variations thereto are possible, all of which fall within the true spirit and scope of the invention.

I claim:

1. Signal selector apparatus for selecting one of several input information signals comprising:
   midvalue selector means, having a plurality of inputs and an output, for passing that input signal having a value between the other input signals to its output; and
   equalizer means including means for predeterminedly processing each information input signal and eliminating null offsets contained therein, said equalizer means further comprising means for intercoupling said midvalue selector means and said equalizer means such that the signal produced at said midvalue selector output is the midvalue one of the equalizer means processed information input signals bounded by those equalizer means processed information input signals having values above and below said midvalue.

2. The signal selector apparatus of claim 1 wherein said equalizer means comprises an equalizing channel for each input information signal, each equalizing channel comprising:
   an integrating means having an input and output;
   combiner means for combining the information signal at the input of the equalizing channel with the output of the midvalue selector and passing the resultant signal to the input of the integration means;
   the equalizer means further comprising:
   a second midvalue selector means receiving the output from all of the equalizing channel integrating means and passing that signal having a value between the other signals to an output; and
   means for coupling the passed output from the second midvalue selector to the input of each equalizing channel integrating means.

3. The signal selector apparatus of claim 2 further including:
   monitoring means for comparing predetermined signals among said equalizing channels with a predetermined fault threshold and identifying, based on said comparison, those channels exhibiting a fault condition.

4. The signal selector apparatus of claim 3 wherein said monitoring means comprises:
   a threshold detector means for comparing each combiner means produced resultant signal to a predetermined threshold level and producing a fault condition signal in response to said resultant signal exceeding said threshold;
   timing means for producing a predetermined time interval in response to the occurence of a fault condition output signal; and
   means for identifying a channel as having failed if the fault condition signal is produced for the duration of the time interval.

5. The signal selector apparatus of either of claims 3 or 4 further including:
   subtractor means coupled to the integrating means output of each channel for producing difference signals among the integrating means produced signals; and
   means for predeterminedly comparing the subtractor means provided difference signals against a predetermined reference level and identifying failed channels in response thereto.

6. The method of selecting one of several information signals comprising the steps of:
   (a) providing a midvalue selector means, having a plurality of inputs and an output, for passing that input signal having a value between the other input signals to its output;
   (b) equalizing, via equalizing means, each information signal and passing said equalized signal to an input of said midvalue selector, said equalizing means equalizing that midvalue passed signal to a steady state value of zero and equalizing the other signals such that their nominal values match that of the midvalue signal, the equalizing means cooperating with said midvalue selector such that the midvalue output from said selector is bounded by the other equalized information signals.

7. The method of claim 6 wherein the step of equalizing includes the further steps of:
   (i) providing equalizer channel processing for each information signal, each equalizing channel processing including the steps of:
      (1) combining the information signal corresponding to said particular equalizer channel processing with the midvalue passed signal;
      (2) multiplying the combined signal by a predetermined gain factor;
      (3) providing an integrating means for integrating signals at its input and producing the resultant at its output;
   (ii) providing a second midvalue selector for receiving a plurality of signals at its input and passing the midvalue signal to an output;
   (iii) coupling the output of each integrating means to an input of said second midvalue selector;
   (iv) multiplying the signal passed by the second midvalue selector by a predetermined gain factor;
   (v) combining the signals produced by steps (i), (2) and iv); and
   (vi) coupling the signal produced by step (v) to the input of the integrating means.

8. The method of claim 7 including the further steps of:
   (c) monitoring and comparing predetermined signals within each equalizing channel with a predetermined fault threshold, and
   (d) identifying those channels exhibiting a fault condition based on the comparison of step (c).

9. The method of claim 7 including the further steps of:
   (c) providing a threshold detector for each equalizing channel, each threshold detector comparing an input signal with a predetermined fault threshold reference and producing a threshold exceedance signal in response to said input signal exceeding said threshold;
   (d) coupling each combined information signal and midvalue passed signal to the input of the threshold detector;
   (e) timing the duration of a threshold exceedance signal within an equalizing signal; and
   (f) identifying a channel as having a fault if the threshold exceedance signal therefrom exceeds a predetermined time interval.

10. The method of claim 7 including the further steps of:
    (c) subtracting each integrating means output from every other integrating means output thereby producing difference signals; and
    (d) comparing said difference signals against a predetermined reference level and identifying those channels carrying signal faults in response thereto.

* * * * *